(12) United States Patent
Williams et al.

(10) Patent No.: US 6,405,228 B1
(45) Date of Patent: Jun. 11, 2002

(54) SELF-ADJUSTING OPTIMAL DELAY TIME FILTER

(75) Inventors: Timothy Williams; Tsunglun Steve Yu, both of Bellevue, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/231,211

(22) Filed: Jan. 14, 1999

(51) Int. Cl.[7] .............................................. G06F 17/10
(52) U.S. Cl. ...................................................... 708/300
(58) Field of Search ........................ 708/300; 327/553; 713/500

(56) References Cited

U.S. PATENT DOCUMENTS 5,043,653 A * 8/1991 Foster et al. ................. 708/300
5,315,539 A * 5/1994 Hawes ......................... 708/300
5,736,893 A * 4/1998 Puckette ...................... 708/300

OTHER PUBLICATIONS

9601/DM9601 Retriggerable One Shot, National Semiconductor Corporation, Jun. 1989, pp. 1–6.
Obsolete Product Possible Substitute Product ICM7555, (CA555, CA555C, LM555C), Harris Semiconductor, Dec. 1999, File No. 834.6, pp. 1–6.

* cited by examiner

Primary Examiner—David H. Malzahn
(74) Attorney, Agent, or Firm—Christopher P. Maiorana, P.C.

(57) ABSTRACT

A circuit comprising a filter circuit and a delay circuit is disclosed. The filter circuit may be configured to present an output signal in response to (i) an input signal having one or more glitches and (ii) a control signal having a plurality of transitions between a first and a second state. The delay circuit may be configured to generate the control signal such that the output signal is generated without glitches. In one example the delay circuit may dynamically adjust the control signal in response to a period of the input signal.

18 Claims, 3 Drawing Sheets

SELF-ADJUSTING OPTIMAL DELAY TIME FILTER

FIELD OF THE INVENTION

The present invention relates to filter circuits generally and, more particularly, to a circuit that filters noise from a signal on a dynamic time-domain basis.

BACKGROUND OF THE INVENTION

A Phase Lock Loop (PLL) circuit can be used to provide frequency domain filtering. However, PLLs generally consume a large amount of chip real estate, are difficult to design, and are process dependent. Additionally, frequency domain filtering is of limited use against high amplitude injected noise such as occurs in standard electrical fast transient burst (EFTB) tests.

SUMMARY OF THE INVENTION

The present invention concerns a circuit comprising a filter circuit and a delay circuit. The filter circuit may be configured to present an output signal in response to (i) an input signal having one or more glitches and (ii) a control signal having a plurality of transitions between a first and a second state. The delay circuit may be configured to generate the control signal such that the output signal is generated without glitches. In one example the delay circuit may dynamically adjust the control signal in response to a period of the input signal.

The objects, features and advantages of the present invention include providing a filtering circuit that may (i) operate independently of process variations, (ii) be ported to various technologies without significant redesign, (iii) use a minimum of chip real estate, (iv) provide a high degree of noise filtering, (v) provide filtering in the time domain, (vi) provide a minimum pulse width output despite a noisy input, and (vii) implement a delay that may be optimized to maximize the effectiveness of the filtering.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention may, in one example, filter noise from a periodic signal on a dynamic time-domain basis. For example, the present invention may prevent signal changes for a period of time, and may dynamically optimize the time period to prevent signal upset from injected EMC or EFTB (Electrical Fast Transient Burst) types of noise. The present invention may be particularly suited to signals like a clock oscillator output where unexpected transitions caused by noise may cause a system failure. The present invention may be particularly useful in microcontroller applications and, more particularly, to Universal Serial Bus (USB) microcontroller applications.

Figure 1:
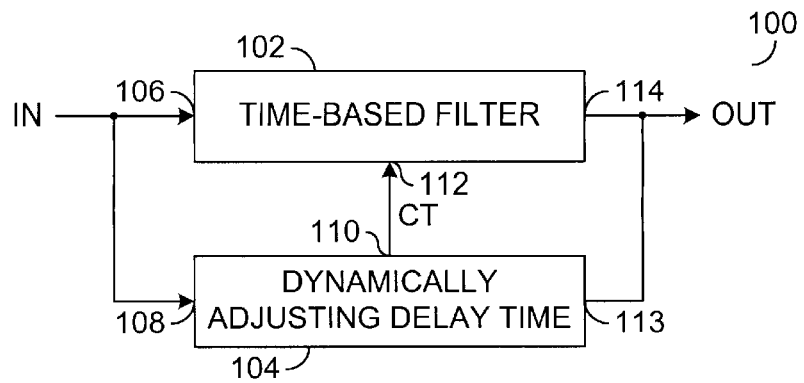
FIG. 1 illustrates a block diagram of a preferred embodiment of the present invention.

Referring to FIG. 1, a circuit 100 is shown in accordance with a preferred embodiment of the present invention. The circuit 100 generally comprises filter block (e.g., a time-based filter circuit) 102 and a delay block (e.g., a dynamically adjusting delay time block) 104. The circuit 102 may have an input 106 that may receive an input signal (e.g., IN). Similarly, the circuit 104 may have an input 108 that may also receive the input signal IN. The input signal IN may be a noisy and/or glitching input signal, such as a periodic signal, that may occur in a noisy circuit. The circuit 104 may have an output 110 that may present a control signal (e.g., CT) to an input 112 of the circuit 102. The delay circuit 104 may also have an input 113 that may receive a feedback of the signal OUT. The circuit 102 may have an output 114 that may present an output signal (e.g., OUT) in response to the input signal IN received at the input 106 and the control signal CT received at the input 112.

The time-based filter block 102 may track the clock edges of the input signal IN. When a rising or falling edge of the input signal IN is detected, the filter block may disable further changes for the amount of time, which may be determined by the delay circuit 104. The delay circuit 104 may adjust the delay to approach the half cycle time of the input signal IN and yet may ensure that the delay will not exceed the half clock cycle. The circuit 100 may, in one example, provide 100% protection against any noise injection by implementing number of counter bits sufficient to generate a resolution just less than the half cycle time of the input signal IN. The proper width of the output signal OUT high and low times may be guaranteed by the dynamically adjusting delay circuit 104. Once the input signal IN transitions, additional output transitions do not generally occur until the delay time expires, regardless of how many times the input signal switches. The circuit 100 may also be immune from set-up and hold-time violations even with a randomly switching input signal IN. The output signal OUT will generally transition smoothly.

Figure 2:
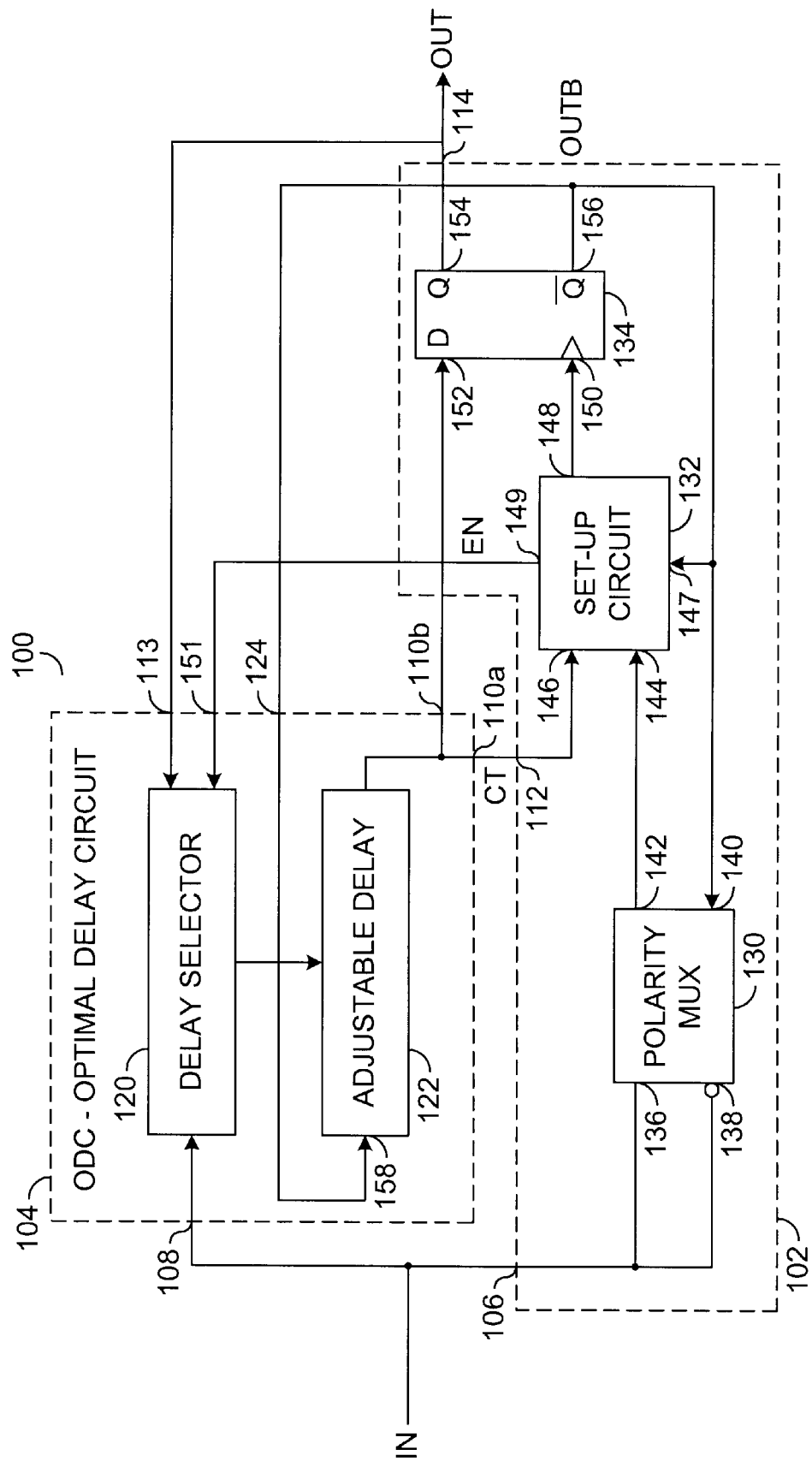
FIG. 2 illustrates a more detailed diagram of the circuit of FIG. 1.

Referring to FIG. 2, a more detailed diagram of the circuit 100 is shown. The delay circuit 104 is shown comprising a delay selector block (or circuit) 120 and an adjustable delay block (or circuit) 122. The delay circuit 104 also has an input 124 that generally receives a feedback of the signal OUT. The adjustable delay 122 generally presents the control signal CT at an output 110a and 110b. The delay time may be continuously adjusted so that a high or a low output time is equal to the average input high or low (i.e., the delay rejects glitches).

The circuit 102 generally comprises a polarity multiplexer 130, a set-up circuit 132 and a flip-flop 134. The polarity multiplexer 130 may have an input 136 that may receive the input signal IN, an input 138 that may receive a digital complement of the input signal IN (e.g., INb), a select input 140 that may receive a select signal (e.g., a signal OUTb, which is generally a digital complement of the signal OUT) from the flip-flop 134 and an output 142 that may present a signal to an input 144 of the set-up circuit 132. The set-up circuit 132 may also have an input 146 that may receive the control signal CT, an input 147 that may receive a feedback of the signal OUTb, an output 148 that may present a signal to a clock input 150 of the flip-flop 134 and an output 149 that may present an enable signal (e.g., EN) to an input 151 of the delay circuit 104. The flip-flop 134 may also have an input 152 that may receive a control signal CT, an output 154 that may present the signal OUT and an output 156 that may present a digital complement of the signal OUT. The signal OUTb presented at the output 156 may be presented to the input 140 of the polarity multiplexer 130, the input 147 of the set-up circuit 132, and to an input 158 of the adjustable delay 122.

The delay circuit 104 may continuously track the input clock signal IN and may extend the time-filter delay to be close to, but less than, the clock pulse width (e.g., high or low) of the input clock signal IN.

By preventing transitions during the delay time, the filter circuit 102 may reject EMC and EFTB noise. The delay circuit 104 may eliminate the dependency of the delay elements to process variations, temperature fluctuations, and voltage changes, by continuously tracking and compensating for these effects. The circuit 100 may be implemented using simple standard cells that may be ported to various technologies without significant redesign. The circuit 100 generally consumes less area than a conventional PLL and yet may provide a similar or better degree of noise rejection. During the delay window, the circuit 100 may act like an infinitely strong frequency domain filter.

The flip-flop 134 may be implemented as a D-type flip-flop that has a delayed data input 152. After the delay presented by the delay circuit 104, the data input 152 is generally an inverted version of the output signal OUT. Under normal operation, the flip-flop 134 may simply change state with every clock edge (e.g., operates like a divide-by-2). The filtering action may take place due to the delay circuit 104. If multiple clocks are received while the data input is unchanged (because the inverted signal has not yet passed through the delay), the output 154 will only toggle on the first clock. Once the signal passes through the delay circuit 104, the flip-flop will toggle on the next clock edge.

Because the flip-flop 134 is generally clocked with a given edge (such as a rising edge), the input clock 150 is generally "doubled" so that a rising edge occurs whenever the input clock transitions (rising or falling edge). An example of such an implementation may be with the multiplexer 130 that may pick either the input signal IN or an inverted-input signal INb, based on the output of the flip-flop 134. This makes the clock input 150 to the flip-flop 134 pulse on each edge of the input signal IN. In another implementation, which is similar to a multiplexer, an XOR gate may be implemented having an input that receives the clock input IN and an input that receives the flip-flop output OUT.

The set-up circuit 132 may prevent a timing hazard at the clock input 150 of the flip-flop 134. The circuit 132 may ensure that the set-up time for the flip-flop 134 is met by preventing any transitions at the flip-flop clock input 150 until the data input 152 has settled. The set-up circuit 132 generally forces one or more gate delays between the data input 152 and the clock input 150 of the flip-flop 134.

In general, once a clock edge occurs, the output 156 of flip-flop 134 transitions, which sends an inverted signal through the delay line. Within a short delay of the flip-flop change, the clock input 150 to the flip-flop 134 is disabled until the data input 152 has settled. If multiple transitions occur rapidly at the clock input 150 (possibly because of noise), the flip-flop 134 does not generally toggle sooner than the delay-line time. As a result, output 154 of the flip-flop 134 is generally filtered from noise that may be received from the input signal IN during the delay time.

The adjustable delay 122 may dynamically adjust to maximize the delay time, while still keeping the delay time just under the high (or low) period of the clock, to maximize the filter effectiveness. This generally keeps the microcontroller internal clock "clean," thus preventing unwanted clock pulses that would otherwise occur too fast for internal circuitry to keep up with. In one example, the adjustable delay 122 may be implemented with digital gates or more elaborate analog delays.

Figure 3:
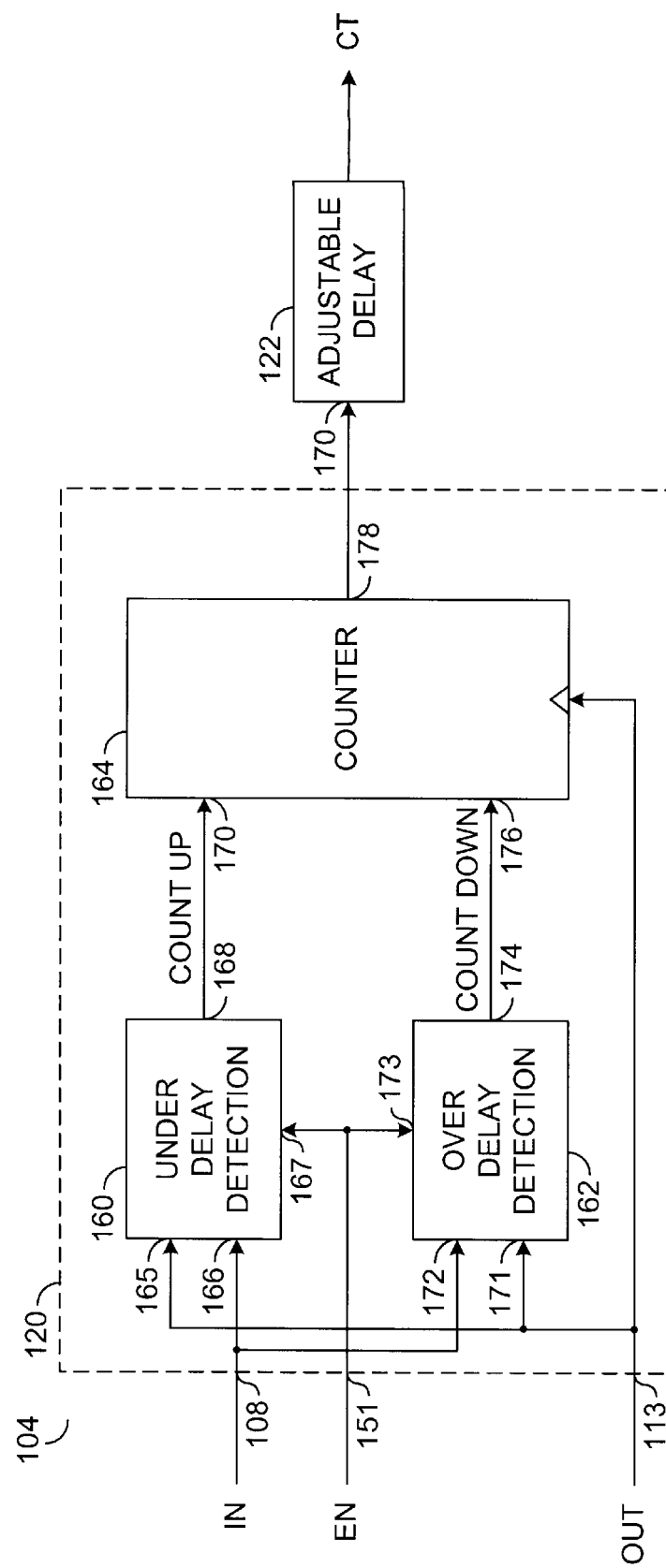
FIG. 3 illustrates a more detailed diagram of the delay circuit.

Referring to FIG. 3, an example of the delay circuit 104 is shown. The delay selector 120 is shown comprising an under delay detection circuit 160, an over delay detection circuit 162 and a counter 164. The under delay detection circuit 160 may have an input 165 that may receive the signal OUT, an input 166 that may receive the signal IN, an input 167 that may receive the signal EN and an output 168 that may present a signal (e.g., Count Up) to an input 170 of the counter 164. The over delay detection circuit 162 may have an input 171 that may receive the signal OUT, an input 172 that may receive the signal IN, an input 173 that may receive the signal EN and an output 174 that may present a signal (e.g., Count Down) to an input 176 of the counter 164. The counter 164 may have an output 178 that may present a signal to an input 180 of the adjustable delay 122.

The delay detectors 160 and 162 generally determine if the adjustable delay 122 should be changed to a more optimal setting in response to (i) the input signal IN, (ii) the output signal OUT and (iii) the enable signal EN. The signal Count Up generally causes the counter 164 to count up when asserted at the rising edge of the signal OUT, which generally increases the adjustable delay time. The signal Count Down generally causes the counter 164 to count down when asserted at the rising edge of the signal OUT, which generally decreases the adjustable delay time. The circuit 104 illustrates one example of an adjustable delay circuit. Other circuits may be implemented accordingly to meet the design criteria of a particular implementation.

Figure 4:
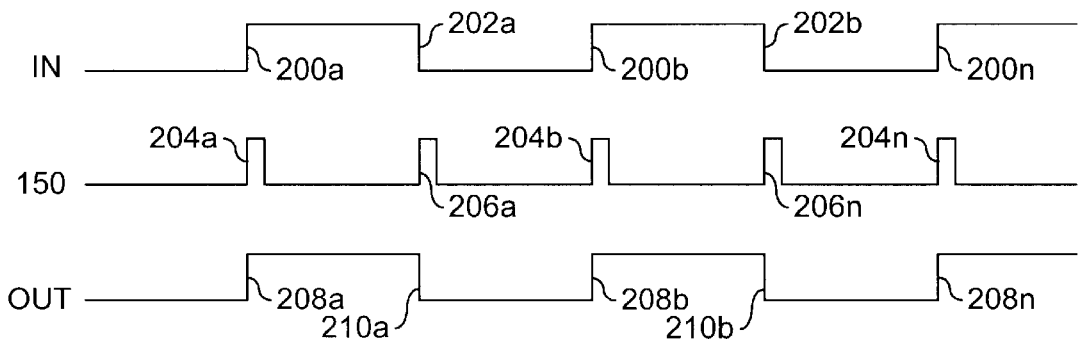
FIG. 4 is a timing diagram of the signals of FIG. 1.
Figure 5:
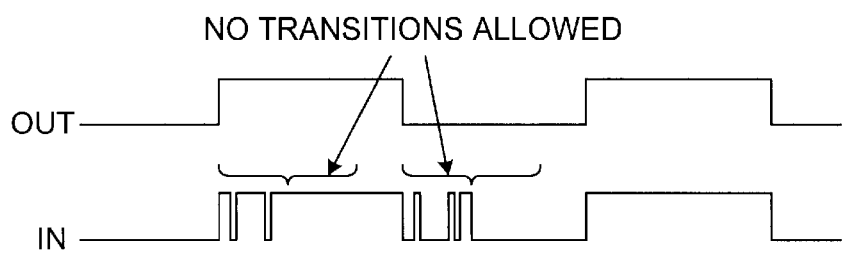
FIG. 5 is a timing diagram illustrating the filtering of the present invention.

Referring to FIG. 4, a timing diagram of the various devices is shown. An input clock signal is shown having a number of positive transitions 200a–200n and a number of negative transitions 202a–202n. Each of the positive transitions 200a–200n generally triggers a pulse 204a–204n of the signal 150. Each of the negative transitions 202a–202n generally triggers a pulse 206a–206n of the signal 150. The pulses 204a–204n generally trigger the positive transitions 208a–208n of the signal OUT and the pulses 206a–206n generally trigger the negative transitions 210a–210n of the signal OUT. The circuit 100 generally only samples the input signal IN during the pulses 204a–204n and 206a–206n. As a result, any glitches that occur on the input signal IN at a time other than during the pulses 204a–204n and 206a–206n are filtered out and do not present the glitches at the output signal OUT. For example, the glitches shown on the input signal IN in FIG. 5 are not presented at the output signal OUT. In addition, multiple transitions of the signal IN during the pulses generally results in only one transition of the signal OUT, since the D-input of the flip-flop 134 does not generally change during such a transition.

Figure 6:
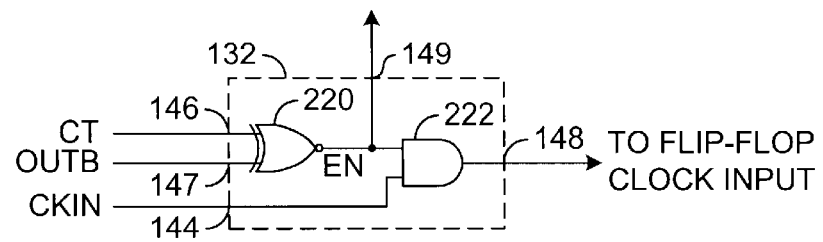
FIG. 6 is a circuit diagram of the set up circuit.

Referring to FIG. 6, a more detailed diagram of the set-up circuit 132 is shown. The set up circuit 132 generally comprises a gate 220 and a gate 222. The gate 220 may be implemented as an XOR gate and the gate 222 may be implemented as an AND gate. The gate 220 generally presents the signal EN to the output 149 and to a first input of the gate 222. The gate 222 presents a signal at the output 148 in response to the enable signal EN and the clock signal (e.g., CKin) received at the input 144. The set up circuit 132 may disable the flip-flop 134 until the delay, generally controlled by the signal CT, has expired. The set up circuit 132 may also ensure that the D-input 152 of the flip-flop 134 is stable before the clock is re-enabled. This may allow for a proper set-up time of the flip-flop 134. FIG. 6 illustrates one example of a set up circuit implemented using the XOR gate 220 and the AND gate 222. Other gates may be implemented accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
   a filter circuit configured to present an output signal in response to (i) an input signal having one or more glitches and (ii) a control signal having a plurality of pulses between a first and a second state; and
   a delay circuit configured to generate said control signal, wherein (i) said filter circuit presents a single transition at said output signal in response to each of said pulses of said control signal to prevent said glitches and (ii) a delay between each of said transitions of said control signal is continuously adjusted to generate a high or low output time equal to the average high or low time of said input signal.

2. The circuit according to claim 1, wherein said control signal is generated in response to (i) said input signal and (ii) said output signal.

3. The circuit according to claim 2, wherein said control signal is generated in further response to an enable signal.

4. The circuit according to claim 1, wherein said delay circuit dynamically adjusts said control signal in response to a period of said input signal.

5. The circuit according to claim 1, wherein said filter circuit further comprises:
   a flip-flop configured to generate said output signal in response to (i) a doubled version of said input signal and (ii) said control signal.

6. The circuit according to claim 5, further comprising:
   a set-up circuit configured to generate said doubled version of said input signal in response to (i) said control signal, (ii) said output signal, and (iii) a set-up input signal.

7. The circuit according to claim 6, further comprising:
   a polarity multiplexer configured to present said set-up input signal in response to (i) said input signal, (ii) a digital complement of said input signal and (iii) said output signal.

8. The circuit according to claim 1, wherein said delay circuit comprises:
   a delay selector circuit configured to generate a delay signal; and
   an adjustable delay circuit configured to generate said control signal in response to said delay signal.

9. The circuit according to claim 8, wherein said delay selector circuit comprises:
   an under delay detection circuit configured to present a count up signal in response to (i) said input signal, (ii) said output signal and (iii) an enable signal;
   an over delay circuit configured to present a count down signal in response to (i) said input signal, (ii) said output signal and (iii) said enable signal; and
   a counter circuit configured to present said delay signal in response to (i) said count up signal, (ii) said count down signal and (iii) said output signal.

10. A circuit comprising:
    means for generating an output signal in response to (i) an input signal having one or more glitches and (ii) a control signal having a plurality of pulses between a first and a second state; and
    means for generating said control signal, wherein (i) a single transition at said output signal is generated in response to each of said pulses of said control signal to prevent said glitches and (ii) a delay between each of said transitions of said control signal is continuously adjusted to generate a high or low output time equal to the average high or low time of said input signals.

11. The circuit according to claim 10, wherein said means for generating said control signal dynamically adjusts said control signal in response to a period of said input signal.

12. A method for filtering an input signal comprising the steps of:
    (a) generating an output signal in response to (i) an input signal having one or more glitches and (ii) a control signal having a plurality of pulses between a first and a second state; and
    (b) generating said control signal, wherein (i) said output signal has a single transition in response to each of said transitions of said control signal to prevent said glitches and (ii) a delay between each of said pulses of said control signal is continuously adjusted to generate a high or low output time equal to the average high or low time of said input signals.

13. The method according to claim 12, wherein step (b) dynamically adjusts said control signal in response to a period of said input signal.

14. The method according to claim 12, wherein step (a) further comprises the step of:
    generating said output signal in response to (i) a doubled version of said input signal and (ii) said control signal.

15. The method according to claim 14, further comprising the step of:
    generating said doubled version of said input signal in response to (i) said control signal, (ii) said output signal, and (ii) a set-up input signal.

16. The method according to claim 15, further comprising the step of:
    generating said set-up input signal in response to (i) said input signal, (ii) a digital complement of said input signal and (iii) said output signal.

17. The method according to claim 12, further comprising the steps of:
    generating a delay signal; and
    generating said control signal in response to said delay signal.

18. The method according to claim 17, further comprising the steps of:
    generating a count up signal in response to (i) said input signal, (ii) said output signal and (iii) an enable signal;
    generating a count down signal in response to (i) said input signal, (ii) said output signal and (iii) said enable signal; and
    generating said delay signal to said adjustable delay circuit in response to (i) said count up signal, (ii) said count down signal and (iii) said output signal.

* * * * *